United States Patent
Crowell, III et al.

(10) Patent No.: US 10,082,417 B2
(45) Date of Patent: Sep. 25, 2018

(54) CALIBRATION METHODS FOR A VISCOUS FLUID DISPENSING SYSTEM

(71) Applicant: Nordson Corporation, Westlake, OH (US)

(72) Inventors: Cutler Crowell, III, San Marcos, CA (US); Payman Tayebi, San Marcos, CA (US)

(73) Assignee: Nordson Corporation, Westlake, OH (US)

( * ) Notice: Subject to any disclaimer, the term of this patent is extended or adjusted under 35 U.S.C. 154(b) by 500 days.

(21) Appl. No.: 14/560,032

(22) Filed: Dec. 4, 2014

(65) Prior Publication Data

US 2015/0184996 A1    Jul. 2, 2015

Related U.S. Application Data

(60) Provisional application No. 61/921,850, filed on Dec. 30, 2013.

(51) Int. Cl.
  *G01D 18/00* (2006.01)
  *G01C 25/00* (2006.01)
  (Continued)

(52) U.S. Cl.
  CPC ..... *G01F 25/0092* (2013.01); *G05B 19/4015* (2013.01); *H01L 22/20* (2013.01);
  (Continued)

(58) Field of Classification Search
  CPC ............ G01F 25/0092; G05B 19/4015; G05B 2219/39026; G05B 2219/45235;
  (Continued)

(56) References Cited

U.S. PATENT DOCUMENTS 5,138,868 A * 8/1992 Long ................. G01N 35/1011
                                                    73/1.79
6,186,609 B1 * 2/2001 Huang ....................... B41J 3/00
                                                    347/2

(Continued)

FOREIGN PATENT DOCUMENTS

CN        101112700 A      1/2008
CN        101147105 A      3/2008
        (Continued)

OTHER PUBLICATIONS

European Patent Office, International Search Report and Written Opinion in PCT Application Serial No. PCT/US2014/069263, dated Mar. 11, 2015.

(Continued)

*Primary Examiner* — Ly D Pham
(74) *Attorney, Agent, or Firm* — Baker & Hostetler LLP

(57) ABSTRACT

A method for calibrating a fluid dispensing system includes the steps of locating an external reference point with an optical sensor, moving a fluid dispenser to the external reference point, dispensing fluid with the fluid dispenser at the external reference point, locating the dispensed fluid with the optical sensor, calculating a distance between the location of the external reference point and the location of the dispensed fluid, determining a correction value based at least in part on the calculated distance, and using the correction value to improve placement accuracy of dispensed fluid.

18 Claims, 11 Drawing Sheets

(51) Int. Cl.
*G06F 3/0484* (2013.01)
*G01F 25/00* (2006.01)
*H01L 21/66* (2006.01)
*G05B 19/401* (2006.01)
*G01P 15/18* (2013.01)
*G01P 21/00* (2006.01)
*G01D 5/244* (2006.01)
*H05K 3/34* (2006.01)

(52) U.S. Cl.
CPC ......... *G01C 25/00* (2013.01); *G01D 5/24452* (2013.01); *G01D 18/00* (2013.01); *G01P 15/18* (2013.01); *G01P 21/00* (2013.01); *G05B 2219/39026* (2013.01); *G05B 2219/45235* (2013.01); *G05B 2219/45238* (2013.01); *G05B 2219/50033* (2013.01); *H05K 3/3478* (2013.01); *H05K 2203/0126* (2013.01)

(58) Field of Classification Search
CPC ........... G05B 2219/45238; G05B 2219/50033; H01L 22/20; H05K 3/3478; H05K 2203/0126
USPC .......................................................... 702/94
See application file for complete search history.

(56) References Cited

U.S. PATENT DOCUMENTS

| | | | |
|---|---|---|---|
| 6,224,180 B1 | 5/2001 | Pham-Van-Diep et al. | |
| 6,540,152 B2 | 4/2003 | Holm et al. | |
| 7,229,145 B2 | 6/2007 | Holm et al. | |
| 7,531,047 B1* | 5/2009 | Dryer | B41J 2/1603 134/1.1 |
| 7,553,375 B2 | 6/2009 | Sekiya | |
| 7,833,572 B2 | 11/2010 | Read | |
| 7,853,352 B2 | 12/2010 | Osterlund et al. | |
| 7,897,918 B2 | 3/2011 | Phaneuf et al. | |
| 7,939,125 B2 | 5/2011 | Abernathy et al. | |
| 8,765,212 B2 | 7/2014 | Abernathy et al. | |
| 2003/0111494 A1* | 6/2003 | Lin | B01L 3/0217 222/505 |
| 2003/0209560 A1* | 11/2003 | Hui | H01L 21/6715 222/1 |
| 2004/0036731 A1* | 2/2004 | Ready | H01L 21/288 347/19 |
| 2004/0118935 A1* | 6/2004 | Holm | B23K 3/0607 239/1 |
| 2004/0148763 A1 | 8/2004 | Peacock et al. | |
| 2005/0001869 A1* | 1/2005 | Abernathy | B05C 5/0225 347/17 |
| 2005/0079106 A1* | 4/2005 | Baker | G01N 35/109 422/400 |
| 2005/0189502 A1* | 9/2005 | Van Bilsen | G03F 9/7046 250/559.3 |
| 2005/0237351 A1* | 10/2005 | Heiles | B41J 29/393 347/9 |
| 2006/0029724 A1 | 2/2006 | Babiarz et al. | |
| 2006/0158474 A1 | 7/2006 | Van Dam et al. | |
| 2006/0210435 A1* | 9/2006 | Alavie | G01N 21/253 422/65 |
| 2008/0006653 A1* | 1/2008 | Dai | B01L 3/0268 222/75 |
| 2009/0078720 A1* | 3/2009 | Abernathy | H05K 3/0008 222/1 |
| 2014/0016841 A1* | 1/2014 | Zahniser | G06T 7/0012 382/128 |
| 2014/0230727 A1* | 8/2014 | Suriawidjaja | B05C 11/00 118/712 |
| 2015/0093498 A1* | 4/2015 | Reid | H05K 3/0085 427/97.3 |

FOREIGN PATENT DOCUMENTS

| | | |
|---|---|---|
| CN | 101391249 A | 3/2009 |
| EP | 0320317 A2 | 6/1989 |
| WO | 9836864 A2 | 8/1998 |
| WO | 2012155267 A1 | 11/2012 |

OTHER PUBLICATIONS

Rita Mohanty et al., "Total System Accuracy"™ for a Dispensing System, Article, 5 pgs., undated.
Speedline Technologies, Camalot XyflexPro®+ Dispensing Systems, Brochure, 4 pgs., 2009.
LPKF Laser & Electronics, Dispensing Solder Paste During the ProtoMat S63 or S103, How-To Brochure, 6 pgs, Sep. 6, 2011.
English Translation of CN Office Action dated Nov. 27, 2017 for CN Application No. 201480071470.

* cited by examiner

CALIBRATION METHODS FOR A VISCOUS FLUID DISPENSING SYSTEM

CROSS-REFERENCE TO RELATED APPLICATION

This application claims the benefit of U.S. Provisional Application Ser. No. 61/921,850, filed Dec. 30, 2013, the disclosure of which is hereby incorporated by reference herein.

TECHNICAL FIELD

The present invention relates generally to methods for calibrating a viscous fluid dispensing system. More particularly, the invention relates to methods for calibrating the placement of viscous fluids dispensed by a viscous fluid dispensing system.

BACKGROUND

In the manufacture of substrates, for example, printed circuit boards ("PCB"), it is frequently necessary to apply small amounts of viscous fluids, i.e. those with a viscosity greater than fifty centipoise. Such fluids include, by way of example, general purpose adhesives, solder paste, solder flux, solder mask, grease, oil, encapsulants, potting compounds, epoxies, die attach pastes, silicones, RTV and cyanoacrylates.

During manufacture, a PCB is often delivered to a viscous fluid dispenser that is mounted to a gantry system and thus movable with three axes of motion above the PCB, for example in a standard X-Y-Z Cartesian coordinate system. The moving fluid dispenser operates in combination with a camera, also mounted to the gantry system and fixed relative to the fluid dispenser, and is capable of dispensing dots of viscous fluid at desired locations on the PCB.

As PCB's are becoming denser and the components mounted thereon are becoming smaller, it is increasingly critical that the dots of viscous fluid are dispensed with a high degree of accuracy, referred to generally as "placement accuracy" or "positional accuracy." One method for evaluating placement accuracy is by comparing the location at which a dot was intended to be dispensed with the location at which the dot was actually dispensed. Many factors contribute to poor placement accuracy of dispensed dots of viscous fluid, including poor camera calibration, misalignment or slight shifting of physical components in the fluid dispensing system, internal software errors, and human error associated with data entered into the software programs controlling the fluid dispenser or camera systems.

A critical step in operating a fluid dispensing system is calculating a camera-to-needle offset value to account for the difference in positions of the fluid dispenser and the camera operating therewith relative to the X-Y plane along which the fluid dispenser and camera move. "Camera-to-needle offset" refers to the distance between the center of the fluid dispenser nozzle, or needle, from which fluid is dispensed and the center of the camera image sensor used to identify the locations at which fluid is dispensed. This camera-to-needle offset value is accounted for by the computer operating the fluid dispensing system so that fluid is then properly dispensed at locations identified by the camera in view of its offset from the dispensing nozzle. For example, a fluid dispensing nozzle and a camera image sensor may be mounted to the gantry system such that their centers are separated by a distance of fifteen centimeters. This fifteen centimeters is recorded as the camera-to-needle offset value, which is then accounted for by the fluid dispensing system when calculating the locations at which to dispense dots of fluid after the locations have been identified by the camera.

Although a preliminary calculation of camera-to-needle offset is performed when the fluid dispenser is installed, it is often insufficient to yield fluid dots that are dispensed with high placement accuracy. In other words, there is still a measurable distance between the location at which a dot was intended to be dispensed, and the location at which the dot was actually dispensed. This is due at least in part to additional sources of error not accounted for by the preliminary camera-to-needle offset value. Such additional sources of error may include slight mechanical shifting of system components after initial movements, which may render the preliminary offset value inaccurate, and/or slight inaccuracies in the execution of software controlling the fluid dispensing system. Current calibration methods for fluid dispensing systems fail to provide steps that adequately account for these additional sources of error so as to optimize dot placement accuracy.

There is a need, therefore, for a fluid dispensing system calibration method that addresses these shortcomings.

SUMMARY

An exemplary method for calibrating a fluid dispensing system includes the steps of locating an external reference point with an optical sensor, moving a fluid dispenser to the external reference point, dispensing fluid with the fluid dispenser at the external reference point, locating the dispensed fluid with the optical sensor, calculating a distance between the location of the external reference point and the location of the dispensed fluid, determining a correction value based at least in part on the calculated distance, and using the correction value to improve placement accuracy of dispensed fluid.

Various additional features and advantages of the invention will become more apparent to those of ordinary skill in the art upon review of the following detailed description of the illustrative embodiments taken in conjunction with the accompanying drawings.

DETAILED DESCRIPTION

Figure 1:
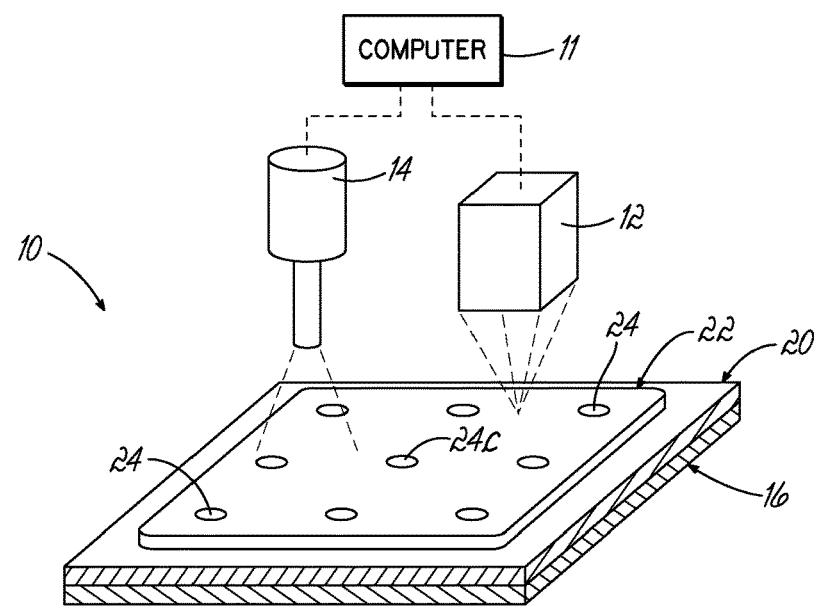
FIG. 1 is a schematic view of a computer-controlled viscous fluid dispensing system including a fluid dispenser and a video camera positioned above a platform.

Referring to the figures, FIG. 1 is a schematic representation of a computer-controlled viscous fluid dispensing system 10 of the type commercially available from Nordson ASYMTEK of Carlsbad, Calif. The system 10 includes a fluid dispenser 12 and a video camera 14 attached to an X-Y positioner (not shown) that is positioned above a platform 16. The fluid dispenser 12 is mounted on a Z-axis drive (not shown) that is suspended from the X-Y positioner, such that the fluid dispenser 12 may translate vertically relative to platform 16 below for dispensing dots of viscous fluids on a substrate positioned on the platform 16. The X-Y positioner and Z-axis drive provide three substantially perpendicular axes of motion for the fluid dispenser 12.

The fluid dispensing system 10 includes a computer 11 for providing the overall control for the system 10. The computer 11 may be a programmable logic controller ("PLC") or other microprocessor based controller, a personal computer, or other conventional control devices capable of carrying out the functions described herein as will be understood by those of ordinary skill in the art. In that regard, the computer 11 may include a processor, a memory, a mass storage memory device, an input/output (I/O) interface, and a Human Machine Interface ("HMI") such as a Graphical User Interface ("GUI"). The computer 11 may also be operatively coupled to one or more external resources via a network or the I/O interface. External resources may include, but are not limited to, servers, databases, mass storage devices, peripheral devices, cloud-based network services, or any other suitable computer resource that may used by the computer 11.

Substrates, such as PCB's (not shown), which are to have dots of viscous fluid, such as adhesive, epoxy, solder, etc, dispensed thereon by the fluid dispenser 12, are manually loaded or horizontally transported to a position directly beneath the fluid dispenser 12 by an automatic conveyor (not shown). During operation of the fluid dispensing system 10, the video camera 14 identifies the locations on the substrate or other target disposed on the platform 16 at which a dot of viscous fluid is to be dispensed. The computer 11 then controls the X-Y positioner to move the fluid dispenser 12 to a position above the desired location above the substrate or other target, and further controls the Z-axis drive to position the fluid dispenser 12 at the proper height for dispensing. The computer 11 then controls the fluid dispenser 12 to dispense a dot of viscous fluid from a nozzle (not shown) of the fluid dispenser 12. A dispensed dot of viscous fluid may have a calculated volume and may be in the form of a drop of fluid having any shape, such as a circular, teardrop, or irregular shape.

Figure 2:
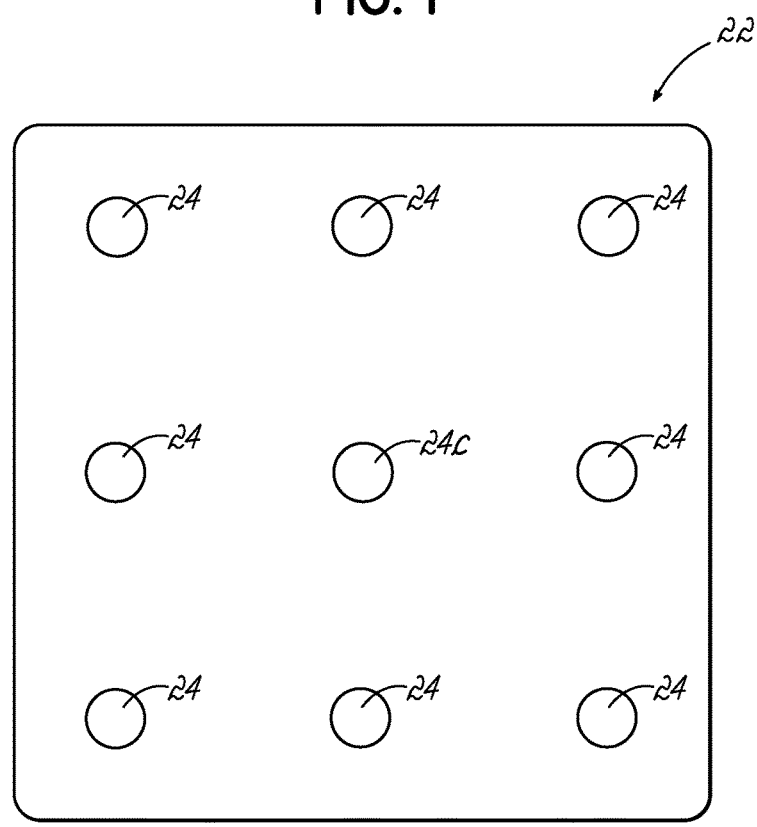
FIG. 2 is a top view of a fiducial tile having a plurality of fiducials printed thereon.

Referring to FIGS. 1 and 2, the platform 16 includes a calibration station 20 configured to accommodate an external target tile 22, referred to as a fiducial tile, that may be removably placed on the platform 16 and is used for calibrating the fluid dispensing system 10. In the embodiment shown, the fiducial tile 22 is planar and has a generally square shape. Additionally, the fiducial tile 22 includes at least one, and preferably at least eight, external reference points 24 printed thereon, referred to as "fiducials" or "targets." The eight fiducials 24 are circular in shape, equally sized at 2 mm in diameter, and equally spaced on the tile 22 in a square or box-like pattern, such that any one side of the square or box-like pattern includes three fiducials 24 positioned with equidistant spacing. In one embodiment, as shown, the target tile 22 may additionally include a centrally positioned fiducial 24c, such that tile 22 includes a total of nine fiducials arranged in a 3-by-3 grid pattern. The central fiducial 24c may be used as an alternative to one of the outer fiducials 24 during initial setup of the calibration routine 29 described below, and is not necessary for actual performance of the calibration routine 29. Persons of ordinary skill in the art may adapt the calibration methods disclosed herein to fiducial tiles and fiducials of any shape, size, quantity, and spacing desired.

Figure 3:
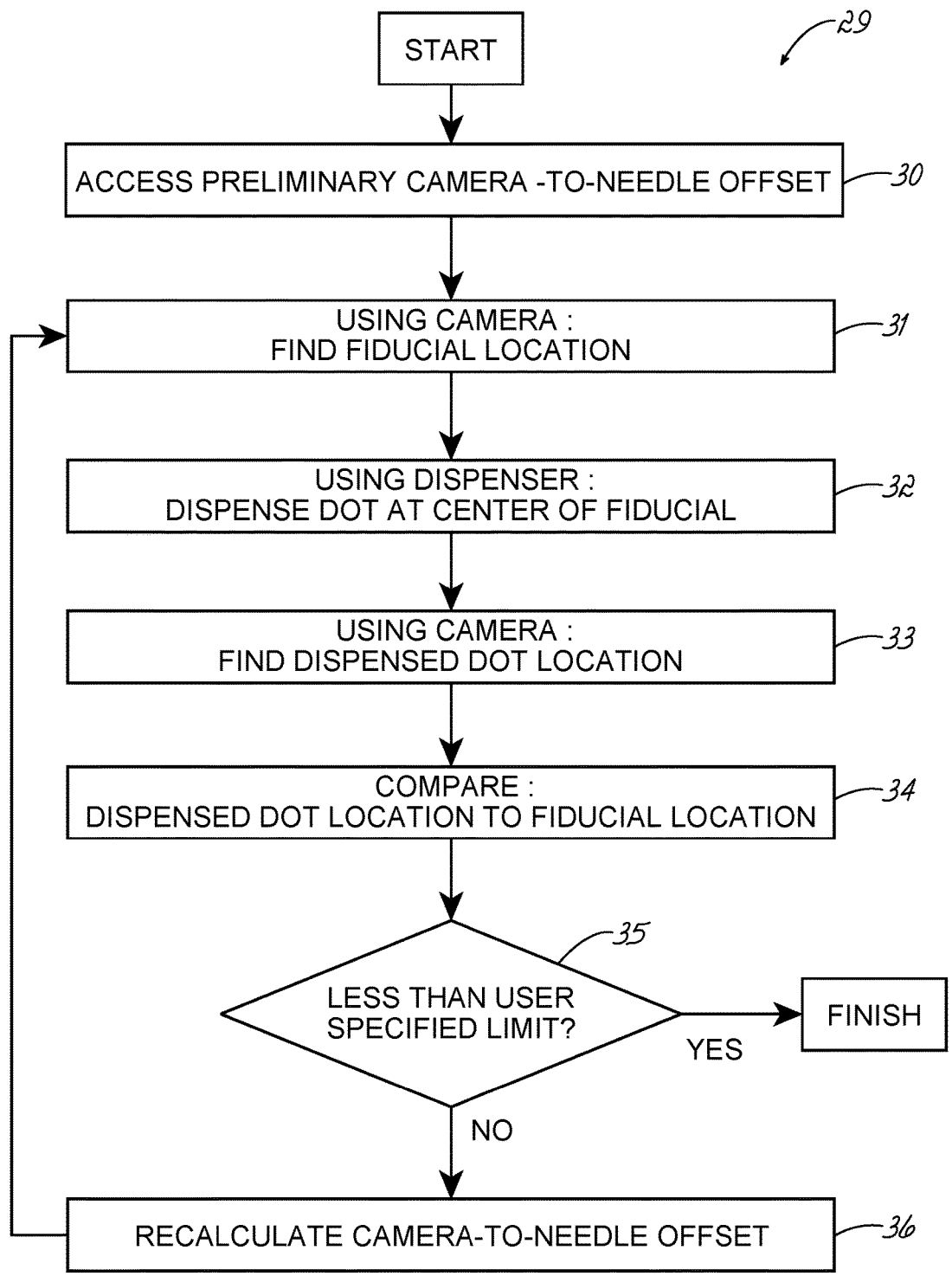
FIG. 3 is a flowchart showing simplified steps of a dot placement calibration routine according to an embodiment of the invention.

FIG. 3 illustrates a simplified version of an automated dot placement calibration routine 29, used for calibrating the placement of dots dispensed by a viscous fluid dispensing system 10, according to one embodiment of the invention. In this dot placement calibration routine 29, the computer 11 first, at 30, accesses a stored preliminary camera-to-needle offset value. As discussed above, the camera-to-needle offset is a two-element array representing the distance, in an X-Y coordinate system, between the center of the nozzle of fluid dispenser 12 and the center of the imaging sensor (not shown) of the video camera 14. The fluid dispenser 12 and video camera 14 are each mounted to the X-Y positioner so as to ideally maintain a known distance between one another in the X-Y plane. For example, in one embodiment the fluid dispenser 12 and the camera 14 may be fixed relative to one another in the X-Y plane. In another embodiment, the fluid dispenser 12 may be movable relative to the camera 14 in the X-Y plane such that the distance defined between the dispenser 12 and the image sensor of the camera 14 is deliberate, measurable, and repeatable. The camera-to-needle offset value, i.e., the X-Y distances between the fluid dispenser 12 and image sensor of the video camera 14, must be accounted for by the computer 11 so that the dispenser 12 may accurately dispense fluids at locations identified by the camera 14. The preliminary camera-to-needle offset value stored within the computer 11 may be, for example, the camera-to-needle offset value from a previous calibration cycle, or it may be a value taught to the computer 11 by a user after taking proper measurements. The measurements for the preliminary offset value may, for example, be taken using computer aided design ("CAD") software.

Next, at 31, the computer 11 commands the camera 14 to move and locate each fiducial 24 on the fiducial tile 22. For steps 31-33, and as explained in greater detail below with reference to the more detailed routine 39 illustrated in FIG. 4, the camera 14 and fluid dispenser 12 both approach each fiducial from a different direction in the X-Y plane so as to account for error associated with each of eight different directions of approach. At 32, the computer 11 commands the fluid dispenser 12 to move to the center of each of the eight outer fiducials 24 and dispense a dot of viscous fluid thereon. As used herein, the term "center" refers to the geometric center in the X-Y plane, known as a centroid, of the object referenced. For example, a fiducial 24, a dot dispensed thereon, the nozzle of the fluid dispenser, and the lens of the camera 14 each have a geometric center (centroid) in the X-Y plane, which is used for calculating X-Y distances between any two of these objects. The centroid of a geometric shape is easily determined, and for a dispensed dot having an irregular, non-geometric shape, its centroid may be calculated by a person of ordinary skill in the art.

At 33, the computer 11 then commands the camera 14 to locate each of the eight dots dispensed on the fiducial tile 22.

At 34, the computer 11 compares the location of each fiducial 24 to the location at which the corresponding dot of fluid was actually dispensed. Specifically, for each fiducial 24, the computer 11 determines the difference between the X-Y coordinates of the center of the fiducial 24 and the X-Y coordinates of the center of its corresponding dispensed dot. The computer 11 then determines the average of these eight values and stores the averaged value, referred to as the "dot offset error value."

At 35, the computer 11 then compares the dot offset error value to a limit value that is taught or otherwise known by the computer 11. If the dot offset error value is less than the limit value, then the fluid dispensing system 10 is deemed to be operating with sufficient dot placement accuracy such that it is adequately calibrated, and the calibration routine ends. If the dot offset error value is not less than the limit value, the computer 11 recognizes that the system 10 is not operating with sufficient dot placement accuracy. Thus, the calibration routine 29 does not end. Instead, the computer 11, at 36, recalculates or otherwise adjusts the camera-to-needle offset value to account for additional error within the system 10. The computer 11 then repeats the process described above, starting at 31, in order to improve dot placement accuracy. The camera-to-needle offset adjustment is described in greater detail below with reference to FIG. 4. Accordingly, the process described herein is an iterative process, in that the computer 11 repeats steps 31-36 until the dot placement error value is less than the limit value, such that dot placement accuracy has been sufficiently improved.

Figure 4:
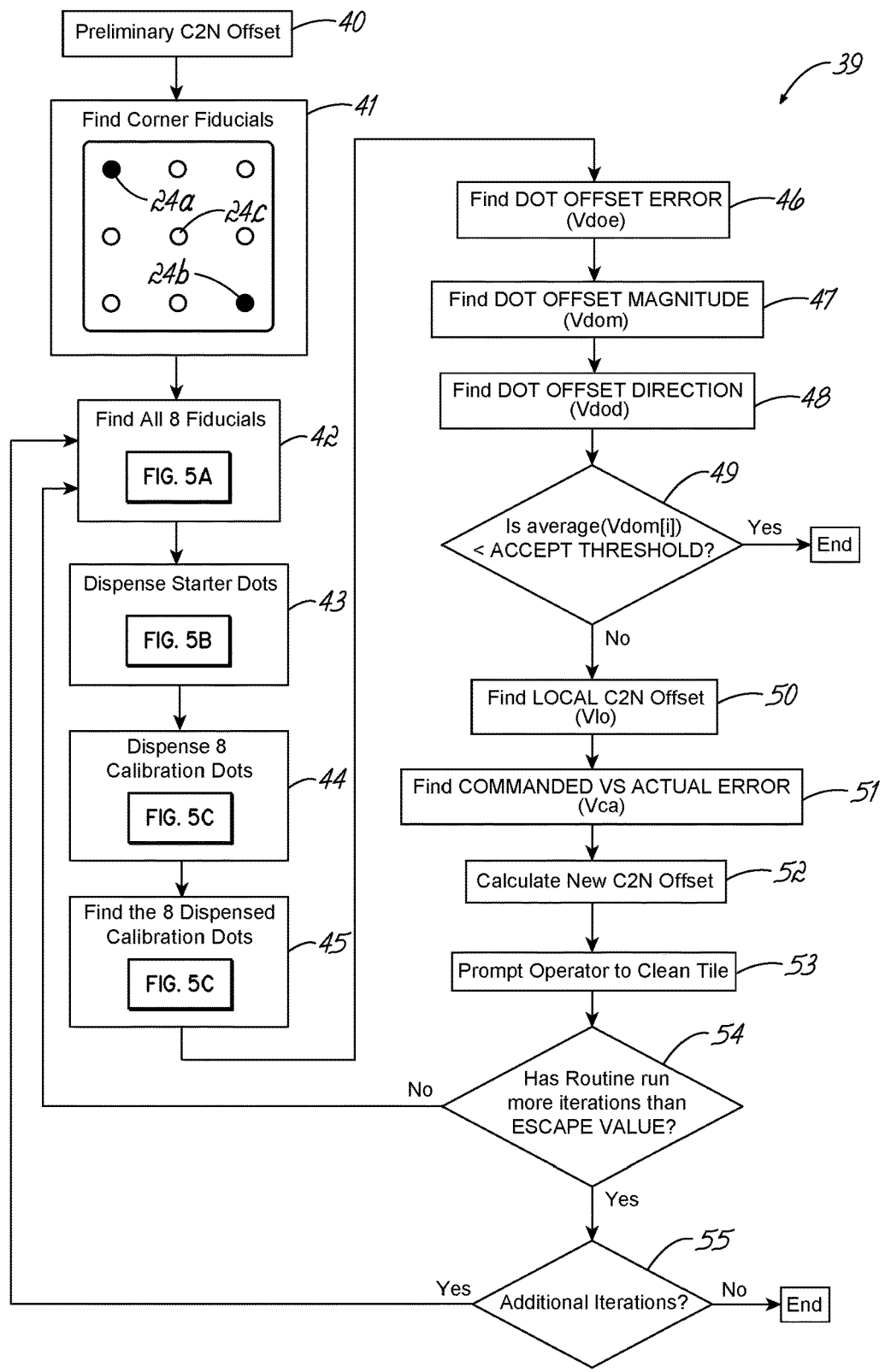
FIG. 4 is a detailed flowchart similar to that of FIG. 3, but showing detailed steps of the dot placement calibration routine.

Referring to FIG. 4, the automated dot placement calibration routine 29 of FIG. 3 is shown with additional detail, as routine 39. At 40, the computer 11 first sets a preliminary camera-to-needle offset array C2N, as described above with reference to FIG. 3. At 41, the computer 11 instructs a user to find the locations of the upper-left fiducial 24a and the lower-right fiducial 24b, and then teach these locations to the computer 11. The computer 11 is programmed to understand that the fiducial tile 22 includes eight circular, outer fiducials 24 spaced equidistantly in a square pattern. Thus, based on the taught locations of the two reference fiducials 24a, 24b, the computer 11 may then determine anticipated locations of the remaining fiducials 24. Persons of ordinary skill in the art will appreciate that the computer 11 may be programmed to understand alternative patterns and quantities of fiducials as well.

At 42, the computer 11 then commands the camera 14 to locate all eight fiducials 24 based on their anticipated locations. The camera 14 approaches the anticipated location of each fiducial 24 from a different direction, as described above. Specifically, as shown by the illustrative embodiment in FIG. 5A, the camera 14 approaches from each of the four Cardinal directions and their four combinations. As used herein, the term "Cardinal directions" refers to the north, east, south, and west directions in an X-Y plane, denoted N, E, S, and W, respectively, in FIG. 5A. Their combinations include northeast, southeast, southwest, and northwest, denoted NE, SE, SW, and NW, respectively, in FIG. 5A. Relative to a fiducial 24 positioned on the fiducial tile 22 in an X-Y plane, north corresponds to an upper border 22a of the fiducial tile 22, east corresponds to a right border 22b, south corresponds to a lower border 22c, and west corresponds to a left border 22d.

Figure 5A:
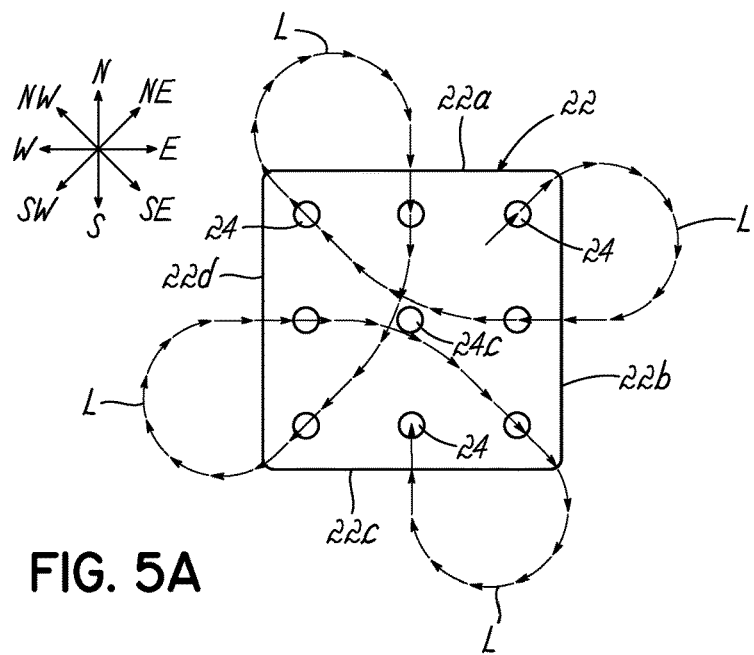
FIG. 5A is a top view similar to FIG. 2, but showing details of a path traversed by the camera for locating fiducials disposed on the fiducial tile according to an embodiment of the invention.

As shown in FIG. 5A, the camera 14 starts at a location near the center of the fiducial tile 22 and approaches a first fiducial 24 from the southwest direction, a second fiducial 24 from the east direction, a third fiducial 24 from the southeast direction, a fourth fiducial 24 from the north direction, a fifth fiducial 24 from the northeast direction, a sixth fiducial 24 from the west direction, a seventh fiducial 24 from the northwest direction, and an eighth fiducial 24 from the south direction. As the camera locates each fiducial 24, an encoder (not shown) is used to note the X-Y coordinates of the center of the fiducial 24. The X-Y coordinates of all eight fiducials 24 are then stored by the computer 11 in a "substrate fiducial location" array $V_{sf}$. Persons of ordinary skill in the art may adapt the calibration methods disclosed herein such that the directions of approach include any desired directions and combinations thereof, and such that the directions of approach account for any desired number of fiducials.

As shown in FIG. 5A, the resultant path traversed by the camera 14 defines a curvilinear shape having four arcuate legs L spaced equally in substantially ninety degree increments about the center of the fiducial tile 22. Approaching the eight fiducials 24 from each of the Cardinal directions and their combinations is advantageous because the fluid dispensing system 10 exhibits a different magnitude of error due to movement depending on the direction of travel, referred to as "directional error." The influence of directional error on the locating of fiducials 24 or dispensed dots is thus minimized by approaching the fiducials 24 and dispensed dots from a plurality of possible directions of travel of the fluid dispenser 12 and the video camera 14 in the X-Y plane.

Figure 5B:
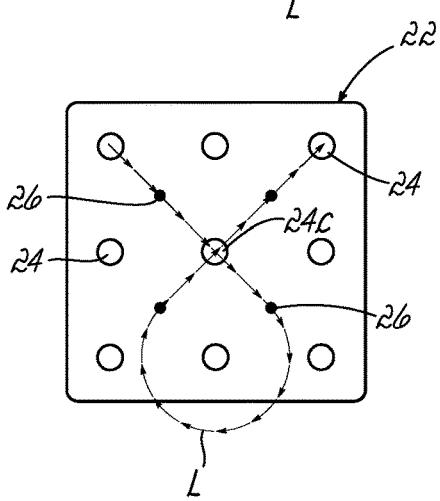
FIG. 5B is a top view similar to FIG. 2, but showing details of a path traversed by the fluid dispenser for dispensing starter dots of viscous fluid according to an embodiment of the invention.

At 43, the computer 11 commands the fluid dispenser 12 to dispense a series of starter dots 26 of fluid onto the fiducial tile 22, the starter dots 26 being of a size, shape, quantity, and pattern defined by a user. In the embodiment shown, at least one, and preferably four, starter dots 26 are dispensed with equidistant spacing to form a square-shaped pattern near the center of the fiducial tile 22, such that the starter dots 26 do not overlap any of the fiducials 24, as shown in FIG. 5B. When dispensing the four starter dots 26, the fluid dispenser 12 approaches the locations for the first and second starter dots 26 from the northwest direction and then approaches the locations for the third and fourth starter dots 26 from the southwest directions, so as to traverse a path defining a curvilinear shape having a single arcuate leg L. Dispensing a series of starter dots 26 allows the fluid dispenser 12 to "spool-up" or "warm-up", such that the fluid dispenser 12 is capable of dispensing accurate and precise volumes of fluid for dots dispensed thereafter.

Figure 5C:
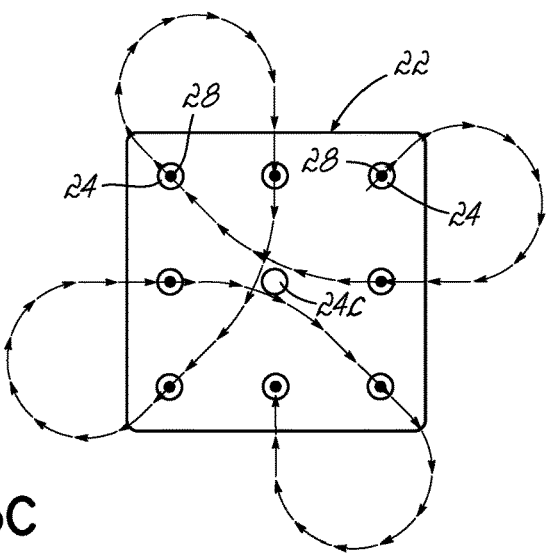
FIG. 5C is a top view similar to FIG. 2, but showing details of a path traversed by the fluid dispenser for dispensing calibration dots of viscous fluid at the center of each fiducial, according to an embodiment of the invention.

At 44, the computer 11 commands the fluid dispenser 12 to dispense a calibration dot 28 of viscous fluid at the center of each of the eight fiducials 24. As shown in FIG. 5C, the fluid dispenser 12 traverses the same path as that previously traversed by the camera 14 when locating each of the eight fiducials 24, described above. As the fluid dispenser 12 dispenses each calibration dot 28, the encoder is used to note the X-Y coordinates of the location to which the fluid dispenser 12 was moved for dispensing the calibration dot 28. The X-Y coordinates of the dispensing location for all eight dispensed calibration dots 28 are then stored by the computer 11 in a "move-to-when-dispensing" array $V_{mt}$.

At 45, the computer 11 then commands the camera 14 to locate each of the eight dispensed calibration dots 28. As shown in FIG. 5C, the camera 14 traverses the same path as that previously traversed by the fluid dispenser 12, at 44, and by the camera 14, at 42. As the camera 14 locates each dispensed calibration dot 28, the encoder is used to note the X-Y coordinates of the center of the calibration dot 28. The X-Y coordinates of each dispensed calibration dot 28 are then stored by the computer 11 in a "calibration dot found" array $V_{cd}$.

At 46, the computer 11 determines a "dot offset error" by comparing, for each dispensed calibration dot 28, the location of the center of the dispensed calibration dot 28 to the location of the center of its corresponding fiducial 24. Specifically, the computer 11 calculates and stores a dot offset error array $V_{doe}$ by taking the difference between the substrate fiducial location array $V_{sf}$ and the calibration dot found array $V_{cd}$, denoted by:

$$V_{doe}=V_{sf}-V_{cd}$$

At 47, the computer 11 calculates and stores a "dot offset magnitude" array $V_{dom}$ by calculating the magnitude of the dot offset error array $V_{doe}$, denoted by:

$$V_{dom}=\text{sqrt}(V_{doe}[x]^2+V_{doe}[y]^2)$$

At 48, the computer 11 determines a "dot offset direction" array $V_{dod}$ by finding, for each dispensed calibration dot 28, the direction in which its center is offset relative to the center of its corresponding fiducial 24.

At 49, the computer 11 determines an "average dot offset magnitude" value by calculating the average of the individual values stored within the dot offset magnitude array $V_{dom}$. The computer 11 then determines whether this average dot offset magnitude value is less than an acceptable threshold or limit value that is taught or otherwise known by the computer 11. The acceptable limit may be defined by a user and communicated to the computer 11. As discussed above with respect to FIG. 3, if the average dot offset error value is less than the acceptable limit, then the calibration routine 39 is finished. If the average dot offset error value is not less than the acceptable limit, then the routine 39 continues with steps directed to recalculating or adjusting the camera-to-needle offset value so as to address sources of error not accounted for by the preliminary camera-to-needle offset value, and ultimately improve dot placement accuracy.

In the case of the latter, at 50 the computer 11 determines a local camera-to-needle offset value for each dispensed calibration dot 28 by comparing the location to which the fluid dispenser 12 was moved for dispensing the calibration dot 28, to the location at which the dispensed dot 28 was actually found by the camera 14. Specifically, the computer 11 calculates and stores a "local camera-to-needle offset" array $V_{lo}$ by calculating the difference between the move-to-when-dispensing array $V_{mt}$ and the calibration dot-fiducial found array $V_{cd}$, denoted by:

$$V_{lo}=V_{mt}-V_{cd}$$

At 51, the computer 11 determines a "commanded vs. actual" error value for each dispensed calibration dot 28 by comparing, for each dispensed calibration dot 28, the location to which the fluid dispenser 12 was commanded to move for dispensing the calibration dot 28, to the location to which the fluid dispenser 12 actually moved for dispensing the calibration dot 28. Specifically, the computer 11 calculates and stores a "commanded vs. actual error" array $V_{ca}$ by calculating the difference between the move-to-when-dispensing array $V_{mt}$, the substrate fiducial location array $V_{sf}$, and the preliminary camera-to-needle offset array C2N, denoted by:

$$V_{ca}=V_{mt}-V_{sf}-C2N$$

At 52, the computer 11 calculates a new camera-to-needle offset value by first calculating, for each dispensed calibration dot 28, an adjusted camera-to-needle offset value that accounts for both the local camera-to-needle offset value and the commanded vs. actual error value associated with a given dispensed calibration dot 28. Specifically, the computer 11 calculates and stores an "adjusted camera-to-needle offset" array $V_{c2n}$ by calculating the sum of the local camera-to-needle offset array $V_{lo}$ and the commanded vs. actual error array $V_{ca}$, denoted by:

$$V_{c2n}=V_{lo}+V_{ca}$$

The computer 11 then calculates the new camera-to-needle offset array C2N by calculating an average of the individual values stored within the adjusted camera-to-needle offset array $V_{c2n}$, denoted by:

$$C2N=\text{average}(V_{c2n}[i])$$

The new, adjusted camera-to-needle offset thus accounts for sources of error in the fluid dispensing system 10 not accounted for by the preliminary camera-to-needle offset. Accordingly, this new camera-to-needle offset may be applied to the system 10 to reduce dot offset error and thereby improve dot placement accuracy during a subsequent cycle of dot dispensing.

At 53, the computer 11 prompts a user to clean the fiducial tile 22 so that an additional iteration of the calibration routine 39 may be performed.

At 54, the computer 11 determines whether the calibration routine 39 has performed a number of iterations that exceeds a user-defined escape value. If the number of iterations performed does not exceed the escape value, an additional iteration of the routine 39 is performed starting at 42. If the number of iterations performed exceeds the escape value, the computer 11 proceeds to 55, at which the computer 11 prompts the user to indicate whether additional iterations of the routine 39 are desired. If additional iterations are not desired, the calibration routine 39 is finished and no additional iterations are performed. If an additional iteration is desired, the computer 11 returns to 42 for an additional iteration of the routine 39.

Referring to FIGS. 6A through 6G, one embodiment of a dot placement calibration, such as routine 39 for example, includes a graphical user interface ("GUI") 59 through which a user may interact with the routine 39. The GUI 59 has a view finder 60 on which the computer 11 displays fiducials 24 and dispensed dots 28 identified by the camera 14. FIGS. 6A-6G show a series of screen shots taken from the computer 11, which may be a personal computer for example, illustrating various stages of user interaction with GUI 59.

Figure 6A:
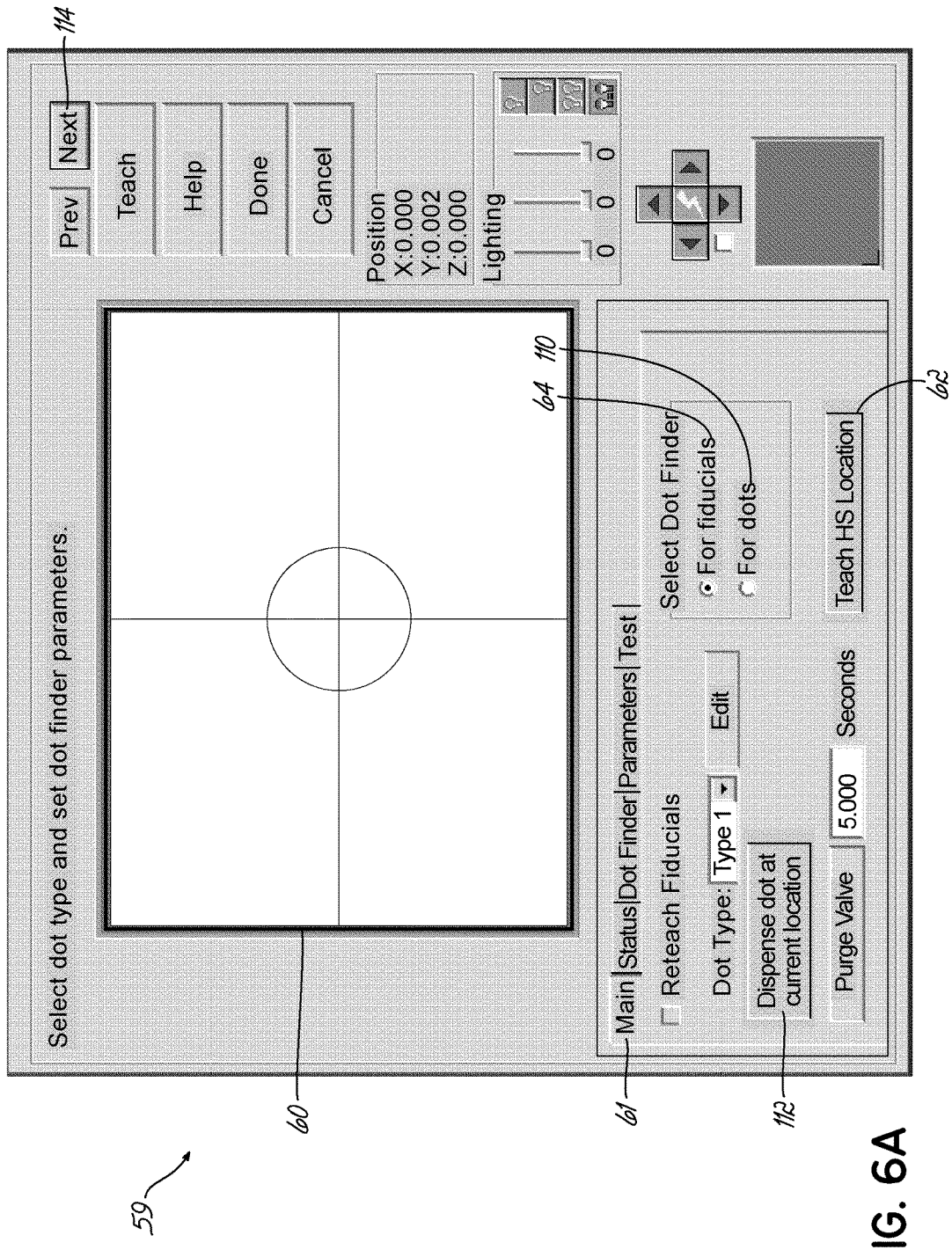
FIGS. 6A-6G are views of a graphical user interface showing various stages of user interaction with a dot placement calibration routine, according to an embodiment of the invention.

A user initiates the calibration routine 39 by selecting the routine 39 in the RUN>SETUP screen of the computer 11, for example. The GUI 59 then displays on the computer 11, and the user is first directed to a "Main" tab 61. The user then moves the camera 14 to a desired location in the X-Y plane at which the fluid dispensing system 10 will measure a height, in the Z-direction, of the fluid dispenser 12 nozzle relative to the fiducial tile 22 before dispensing a dot 28 thereon. This X-Y location is referred to as the "height-sense location," and is accounted for by the computer 11 when commanding the fluid dispenser 12 to move toward a lowered position along the Z-axis for dispensing a dot 28 on the fiducial tile 22. This height may be measured using any suitable device (not shown), such as a laser or a mechanical measuring device, for example. As shown in FIG. 6A, the user then selects "Teach HS Location" 62 to teach the height-sense location to the computer 11 operating the calibration routine 39. The user then selects "For Fiducials" 64 to set the parameters that the routine 39 will use to find the fiducials 24.

Figure 6B:
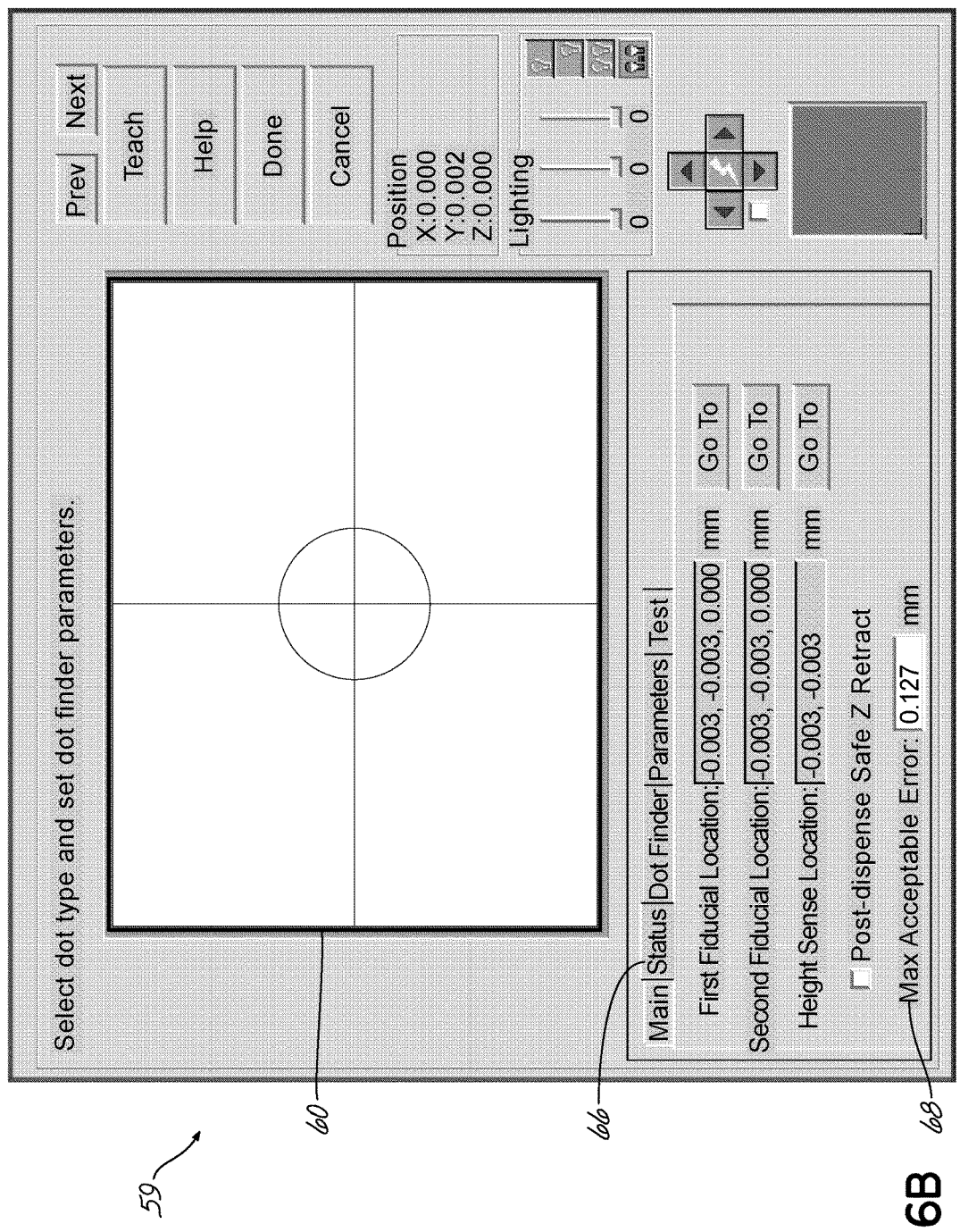

Referring to FIG. 6B, the user then selects a "Status" tab 66 and defines a "Max Acceptable Error" 68, which sets the maximum dot offset error used by the routine 39 as success criteria.

Figure 6C:
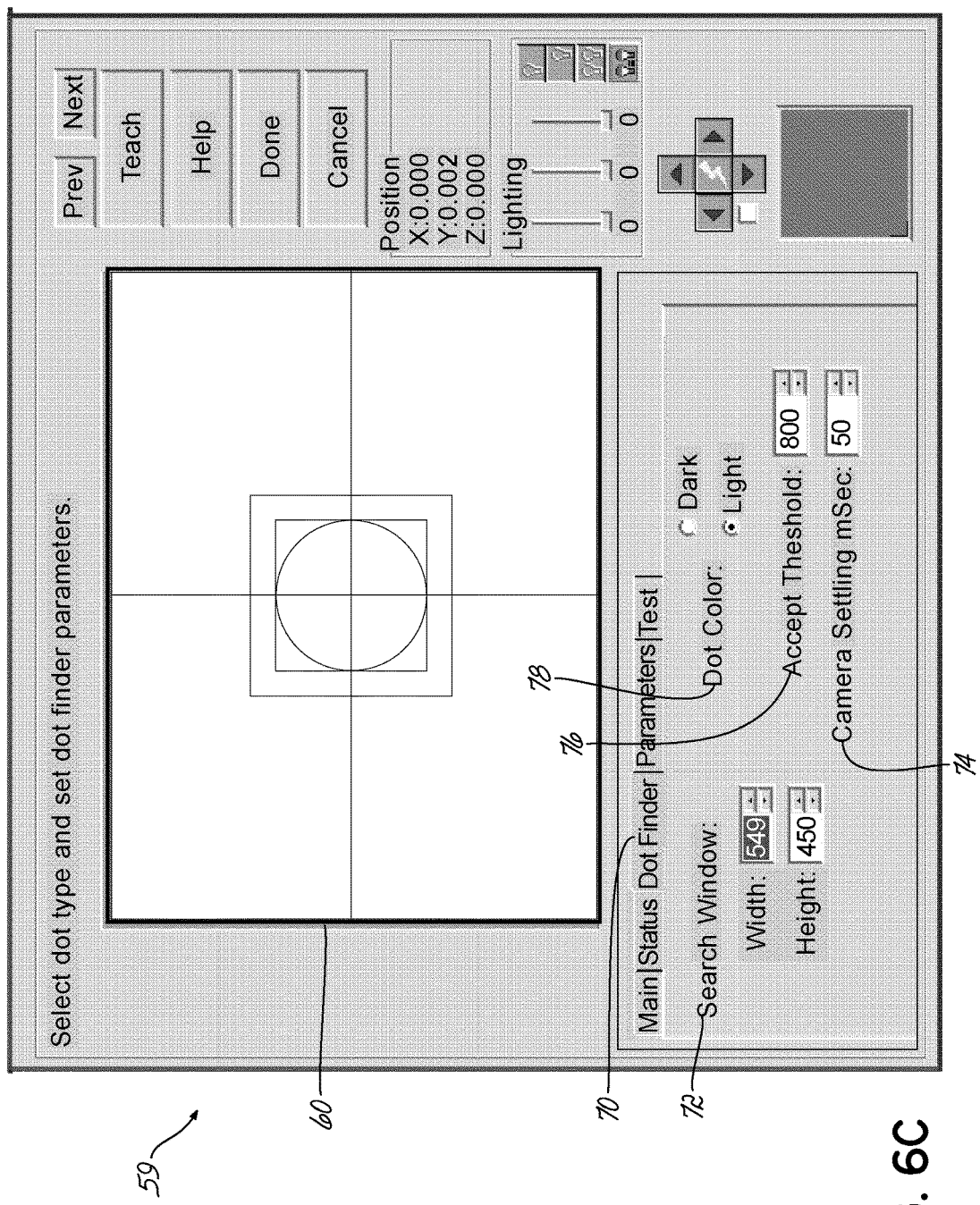

Referring to FIG. 6C, the user then selects a "Dot Finder" tab 70 and defines a Search Window 72, a Camera Settling Time 74, and an Acceptance Threshold 76 for the fiducials 24. The Dot Color 78 has no effect on the outcome of the routine 39.

Figure 6D:
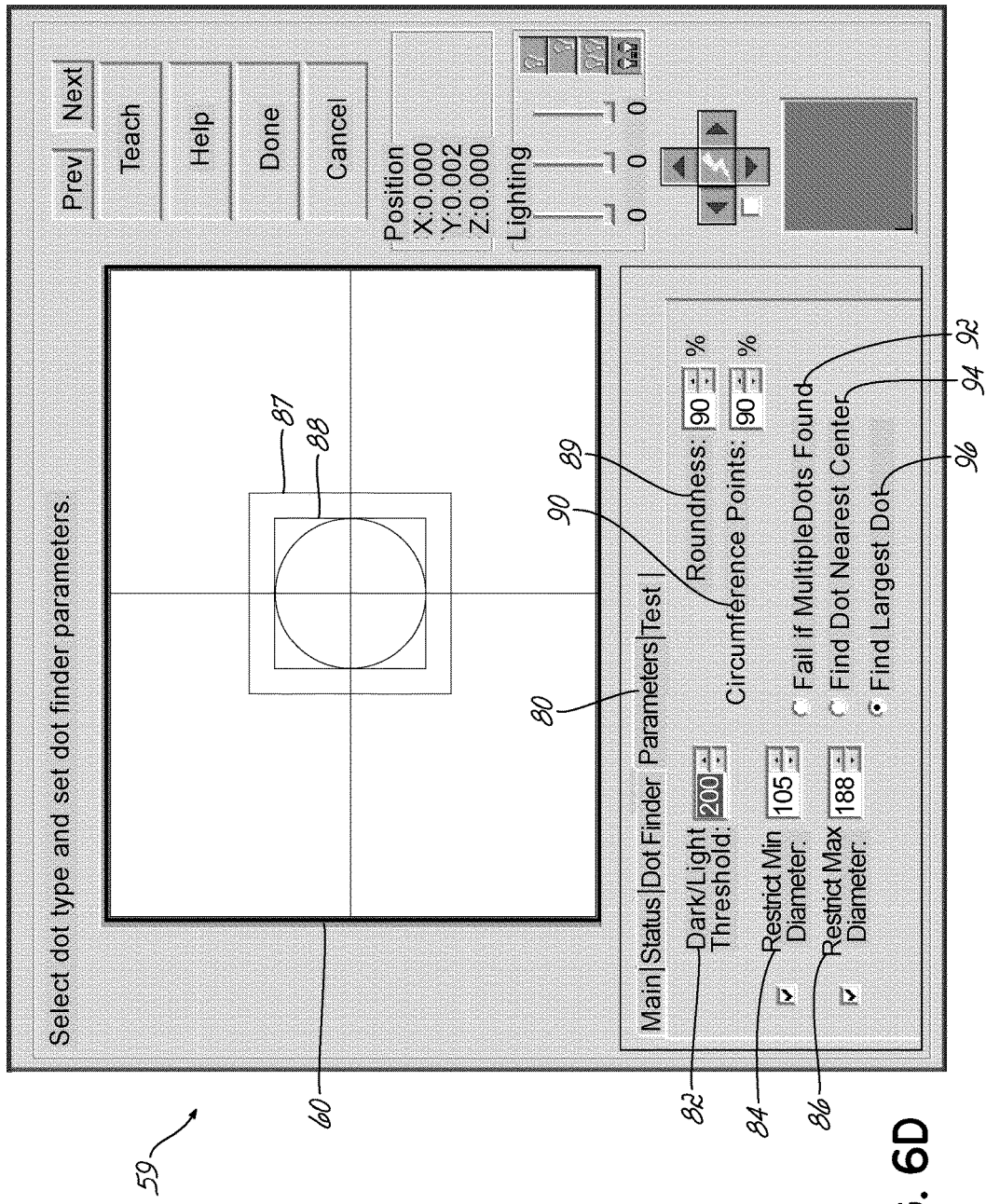

Referring to FIG. 6D, the user then selects a "Parameters" tab 80 to set parameters 82-96 used to locate the fiducials 24. A Dark/Light Threshold 82 defines the shade of grey corresponding to the edges of a circle, such as a fiducial 24 or a dispensed dot 28, identified by the camera 14. In the embodiment shown, a Dark/Light Threshold 82 value of zero corresponds to black, and a value of 255 corresponds to white. Accordingly, if a fiducial 24 is identified by the camera 14 as a white circle, a value of approximately 200 should be entered. If the fiducial 24 is identified as a black circle, then a value of approximately 80 should be entered. Restrict Min Diameter 84 and Restrict Max Diameter 86 restrict the minimum and maximum diameter of a circle identifiable by the camera 14 operated by the routine 39. These parameters 84, 86 are used to filter out "bad" circles when multiple circles are identified by the camera 14 and displayed within the view finder 60. The values entered for these parameters 84, 86 control the widths of an outer box 87 and an inner box 88 drawn by the computer 11 within the view finder 60. In this manner, the width of the outer box 87 corresponds to the value entered for Restrict Max Diameter 86, and the width of the inner box 88 corresponds to the value entered for Restrict Max Min Diameter 84. The units associated with the values entered for these parameters 84, 86 are pixels.

Still referring to FIG. 6D, Roundness 89 corresponds to the anticipated roundness of a circle, such as a fiducial 24 or a calibration dot 28, to be identified by the camera 14. For example, a perfect circle corresponds to a Roundness 88 value of 100%, and an amorphous blob corresponds to a Roundness 88 value of 0%. If the user anticipates that good, round circles will be consistently identified, a value of approximately 90% should be entered. Circumference Points 90 corresponds to how much of an identified circle, such as a fiducial 24 or a dispensed dot 28, will be visible. For example, a full circle corresponds to a value of 100%, and a half-circle corresponds to a value of 50%. If the user anticipates that full circles will be consistently identified, a value of approximately 90% should be entered.

Still referring to FIG. 6D, Fail If Multiple Dots Found 92, Find Dot Nearest Center 94, and Find Largest Dot 96 each define the action to be taken by the computer 11 executing the routine 39 in the event that multiple identified circles each satisfy the Restrict Min Diameter 84, Restrict Max Diameter 86, Roundness 89, and Circumference Points 90 parameters. Fail If Multiple Dots Found 92 results in the computer 11 acting as if no fiducial 24 was ever found. Find Dot Nearest Center 94 and Find Largest Dot 96 each result in the computer 11 performing as described without prompting the user.

Figure 6E:
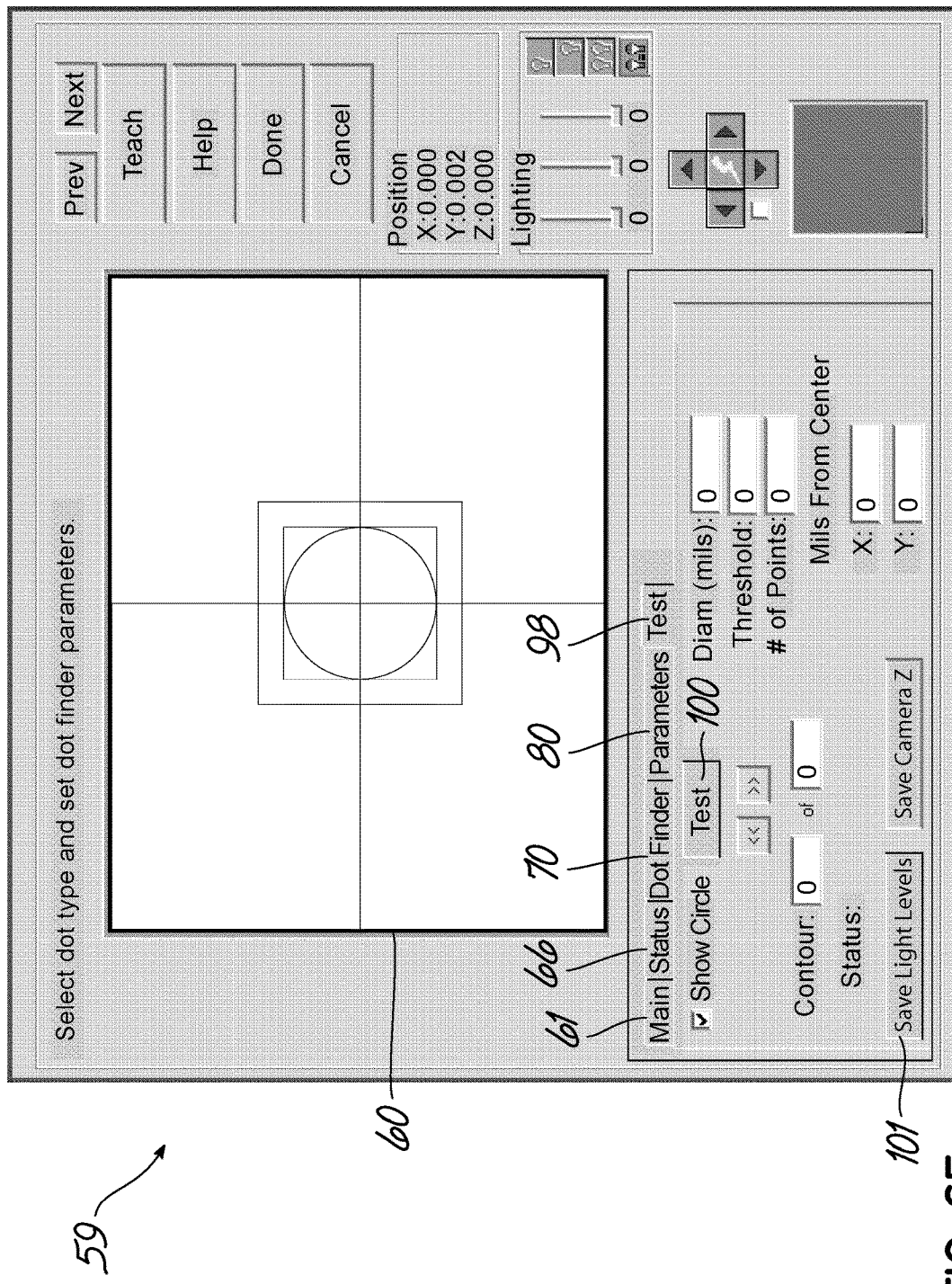

Referring to FIG. 6E, the user then selects a "Test" tab 98 while a fiducial 24 is shown in the view finder 60 to determine whether the routine 39 is able to properly identify the fiducial 24. A "Test" button 100 is preferably selected multiple times for the same fiducial 24, and additionally for at least one other fiducial 24 to simulate multiple runs. If selecting the "Test" button 100 highlights erroneous circles, the user should then return to the previous tabs 66, 70, and 80 to adjust the proper parameters, and then return to the "Test" tab 98 to ensure proper operation. Once the tests are satisfactory, the user then selects "Save Light Levels" 101 to save the settings used to identify the fiducials 24.

Referring back to FIG. 6A, the user then selects "For Dots" 110 to begin setting the parameters used to identify the dispensed dots 28 during the routine 39. The user then positions the center of a fiducial 24 within the view finder 60 and selects "Dispense dot at current location" 112. This commands the fluid dispenser 12 to dispense a single dot 28 than can be used to set the Dot Finder 70 parameters. The user then repeats the steps described above using the dispensed dot 28, rather than a fiducial 24, as the target. Once the dispensed dot settings are set and saved, the user then selects the "Next" button 114.

Figure 6F:
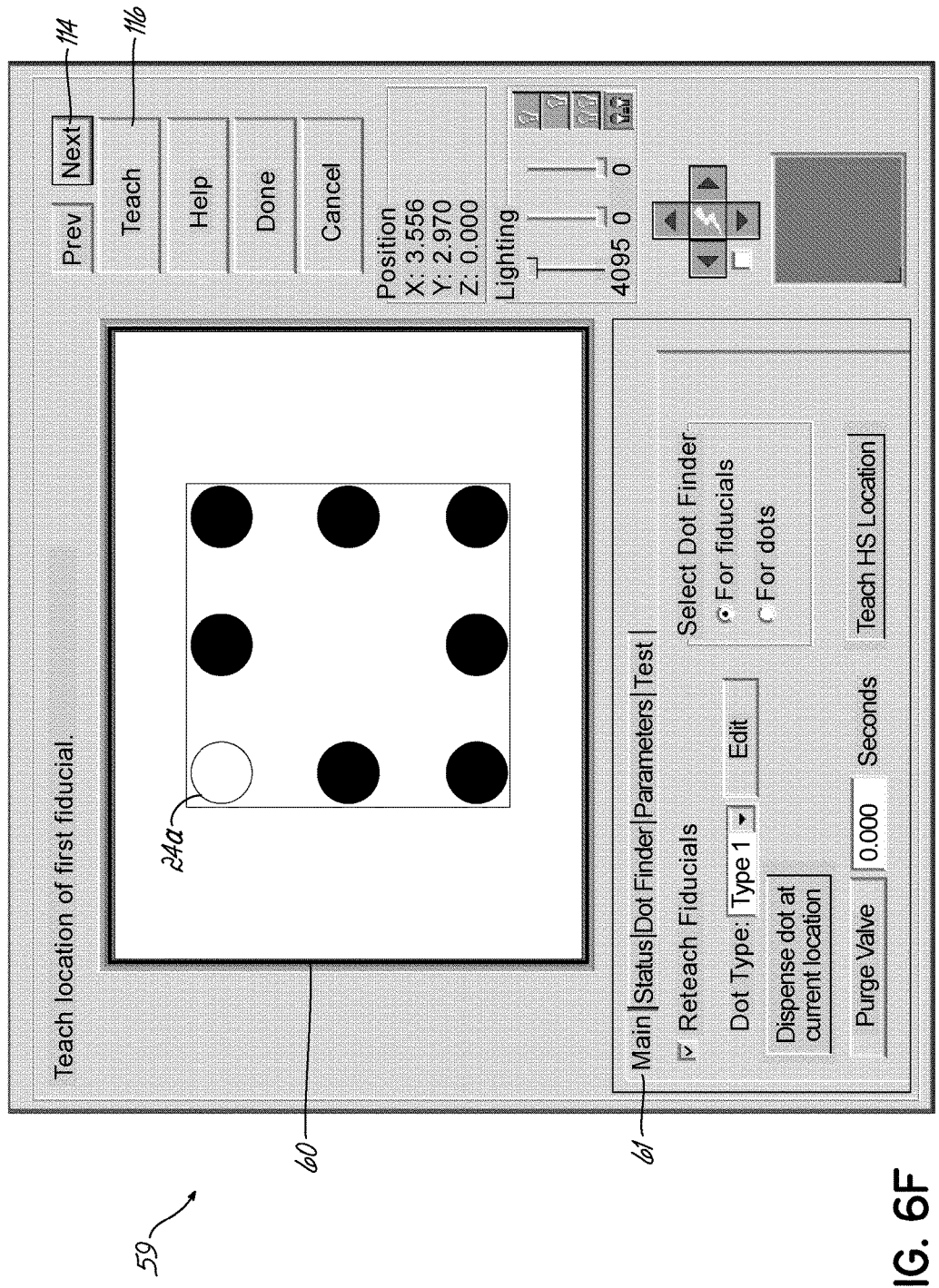

Referring to FIG. 6F, and still on the Main tab 61, the routine 39 then prompts the user to locate a first, upper-left fiducial 24a. The user selects "Next" 114 to continue. The user then positions the upper-left fiducial 24a in the view finder 60 and selects "Teach" 116, which causes the computer 11 to save the X-Y coordinates of the upper-left fiducial 24a.

Figure 6G:
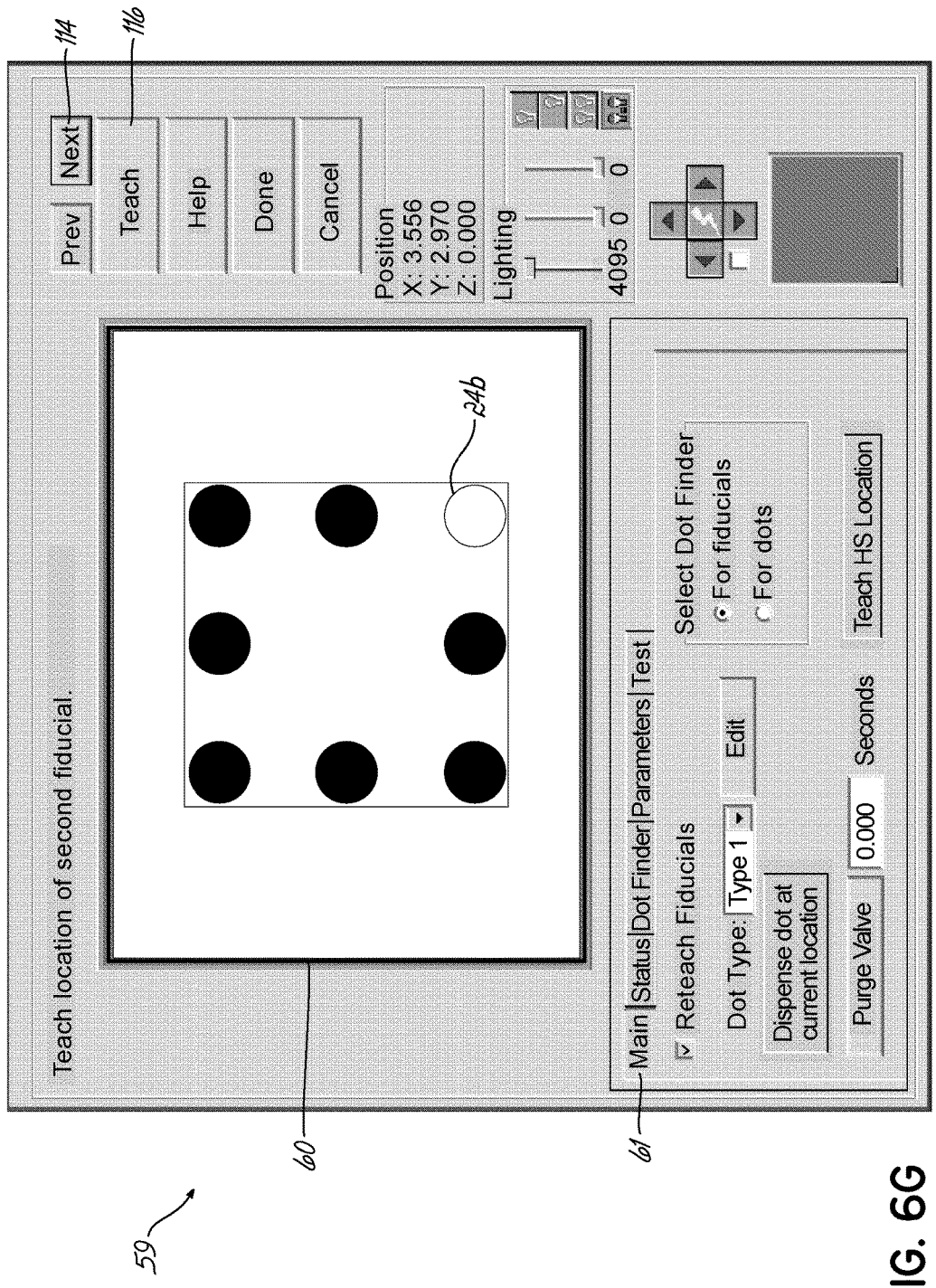

Referring to FIG. 6G, the routine 39 then prompts the user to locate a second, lower-right fiducial 24b. The user selects "Next" 114 to continue. The user then positions the lower-right fiducial 24b in the view finder 60 and selects "Teach" 116, which causes the computer 11 to save the X-Y coordinates of the lower-right fiducial 24b. Using the steps described above with respect to FIGS. 3-5C, the routine 39 then locates all eight fiducials 24, dispenses a calibration dot 28 at the center of each fiducial 24, locates the dispensed calibration dots 28, and calculates a dot offset error. If the dot offset error is greater than a user defined limit, a pop-up error window (not shown) alerts the user, by displaying a message such as "The average dot offset magnitude of [value] exceeds the acceptable threshold of [value] inch." The user acknowledges the message by selecting an "OK" button (not shown), wipes the fiducial tile 22 clean, and then selects "Next" 114. The routine 39 may then repeat the steps described above in order to improve dot placement accuracy of a fluid dispensing system. If the new dot offset error is less than the user-defined limit, the routine 39 is successful and a pop-up window (not shown) displaying the results will appear. This pop-up window may include a message such as "Valve-to-camera offset=([x value],[y value]) inch. Acceptable dot offset error=[value] inch. Average dot offset error=[value] inch." The user acknowledges the message by selecting an "OK" button, and then ends the routine 39 by selecting a "Done" button.

The calibration routine 39 and GUI 59 described above may be modified as needed by persons of ordinary skill in the art for use with fiducial tiles having fiducials of any suitable shape, quantity, and configuration.

While the present invention has been illustrated by the description of specific embodiments thereof, and while the embodiments have been described in considerable detail, it is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of the general inventive concept.

What is claimed is:

1. A method for calibrating a fluid dispensing system, the system including a fluid dispenser and an optical sensor, the method comprising:
   (i) locating an external reference point on a substrate with the optical sensor;
   (ii) moving the fluid dispenser to the external reference point;
   (iii) dispensing fluid with the fluid dispenser;
   (iv) locating the dispensed fluid with the optical sensor;
   (v) calculating a distance between the location of the external reference point and the location of the dispensed fluid;
   (vi) determining a correction value based at least in part on the calculated distance; and
   (vii) moving the fluid dispenser based on the correction value to improve placement accuracy of dispensed fluid, wherein:
   the substrate further includes at least one additional external reference point,
   steps (i) through (v) are also performed for the at least one additional external reference point,
   determining the correction value comprises determining the correction value based at least in part on a value determined by averaging the calculated distances corresponding to each of the external reference points, and
   each of the external reference points is approached by the fluid dispenser from a different direction.

2. The method of claim 1, wherein the system further comprises a controller configured to automatically control steps (i) through (vii).

3. The method of claim 1 further comprising:
   iterating steps (i) through (vii) until the calculated distance is less than an upper limit.

4. The method of claim 1, wherein the substrate is a tile.

5. The method of claim 4, wherein the tile has at least eight external reference points, and each of the at least eight external reference points is approached by the fluid dispenser from a different direction.

6. The method of claim 1, wherein the external reference point and the dispensed fluid each have a centroid and calculating the distance further comprises:
   calculating the distance between the centroid of the external reference point and the centroid of the dispensed fluid.

7. The method of claim 1, wherein dispensing the fluid with the fluid dispenser further comprises dispensing a drop of the fluid with the fluid dispenser.

8. A method for calibrating a fluid dispensing system, the system including a fluid dispenser and an optical sensor, the method comprising:
   locating a first external reference point positioned on a substrate with the optical sensor;
   moving the fluid dispenser to the first external reference point;
   dispensing first fluid with the fluid dispenser;
   locating the first dispensed fluid with the optical sensor;
   calculating a first distance between the location of the first external reference point and the location of the first dispensed fluid;
   locating a second external reference point positioned on the substrate with the optical sensor;
   moving the fluid dispenser to the second external reference point, wherein the second external reference point is approached by the fluid dispenser from a different direction that the first external reference point;
   dispensing second fluid with the fluid dispenser;
   locating the second dispensed fluid with the optical sensor;
   calculating a second distance between the location of the second external reference point and the location of the second dispensed fluid;
   determining a correction value based at least in part on a value determined by averaging the calculated first distance and the calculated second distance; and
   moving the fluid dispenser based on the correction value to improve placement accuracy of dispensed fluid.

9. The method of claim 8, wherein the system further comprises a controller configured to automatically control the steps of the method.

10. The method of claim 8, further comprising iterating the steps of the method until the averaged distance is less than an upper limit.

11. The method of claim 8, wherein the substrate is a tile, and the tile has at least eight external reference points, and each of the at least eight external reference points is approached by the fluid dispenser from a different direction.

12. The method of claim 8, wherein the first external reference point and the first dispensed fluid each have a centroid and calculating the first distance further comprises:
   calculating the first distance between the centroid of the first external reference point and the centroid of the first dispensed fluid.

13. The method of claim 8, wherein dispensing the fluid with the fluid dispenser comprises dispensing a drop of the fluid.

14. A method for calibrating a fluid dispensing system, the system including a fluid dispenser and an optical sensor, the method comprising:
   locating a first external reference point on a substrate with the optical sensor, the first external reference point having a centroid;
   moving the fluid dispenser to the first external reference point;
   dispensing first fluid with the fluid dispenser;
   locating the first dispensed fluid with the optical sensor, the first dispensed fluid having a centroid;
   calculating a first distance between the centroid of the first external reference point and the centroid of the first dispensed fluid;
   locating a second external reference point on the substrate with the optical sensor, the second external reference point having a centroid;
   moving the fluid dispenser to the second external reference point, wherein the second external reference point is approached by the fluid dispenser from a different direction that the first external reference point dispensing second fluid with the fluid dispenser;
   locating the second dispensed fluid with the optical sensor, the second dispensed fluid having a centroid;
   calculating a second distance between the centroid of the second external reference point and the centroid of the second dispensed fluid;
   determining a correction value based at least in part on a value determined by averaging the calculated first distance and the calculated second distance; and
   moving the fluid dispenser based on the correction value to improve placement accuracy of dispensed fluid.

15. The method of claim 14, wherein the system further comprises a controller configured to automatically control the steps of the method.

16. The method of claim 14, further comprising iterating the steps of the method until the calculated distance is less than an upper limit.

17. The method of claim 14, wherein the substrate is a tile.

18. The method of claim 17, wherein the tile has at least eight external reference points, and each of the at least eight external reference points is approached by the fluid dispenser from a different direction.

* * * * *